US012813262B2

(12) United States Patent
Shi et al.

(10) Patent No.: US 12,813,262 B2
(45) Date of Patent: Nov. 24, 2026

(54) PACKAGE MODULE WITH A PLURALITY OF STACKED SUBSTRATES HAVING MULTIPLE POWER CHIPS

(71) Applicant: BYD SEMICONDUCTOR COMPANY LIMITED, Shenzhen (CN)

(72) Inventors: Shoucao Shi, Shenzhen (CN); Qiulian Zeng, Shenzhen (CN); Chuanming Luo, Shenzhen (CN); Haiping Wu, Shenzhen (CN)

(73) Assignee: BYD SEMICONDUCTOR COMPANY LIMITED, Shenzhen (CN)

( * ) Notice: Subject to any disclaimer, the term of this patent is extended or adjusted under 35 U.S.C. 154(b) by 711 days.

(21) Appl. No.: 18/337,975

(22) Filed: Jun. 20, 2023

(65) Prior Publication Data

US 2023/0335457 A1 Oct. 19, 2023

Related U.S. Application Data

(63) Continuation of application No. PCT/CN2021/141373, filed on Dec. 24, 2021.

(30) Foreign Application Priority Data

Dec. 25, 2020 (CN) ........................ 202011565454.5

(51) Int. Cl.
*H10W 40/22* (2026.01)
*H10W 40/25* (2026.01)
(Continued)

(52) U.S. Cl.
CPC ......... *H10W 40/22* (2026.01); *H10W 40/255* (2026.01); *H10W 70/611* (2026.01);
(Continued)

(58) Field of Classification Search
CPC . H10W 90/00; H10W 90/724; H10W 90/401; H10W 40/22; H10W 74/127;
(Continued)

(56) References Cited

U.S. PATENT DOCUMENTS 9,041,183 B2 * 5/2015 Liang .................... H10W 40/47 257/691
11,139,278 B2 * 10/2021 Niu ....................... H10W 90/00
2013/0241043 A1 9/2013 Kato et al.
(Continued)

FOREIGN PATENT DOCUMENTS

CN 104134638 A 11/2014
CN 105070695 A 11/2015
(Continued)

OTHER PUBLICATIONS

The World Intellectual Property Organization (Wipo) International Search Report for PCT/CN2021/141373 Mar. 10, 2022 5 Pages.

*Primary Examiner* — Alonzo Chambliss
(74) *Attorney, Agent, or Firm* — Wenye Tan

(57) ABSTRACT

A power module includes a positive input electrode, a negative input electrode, an upper bridge substrate, a lower bridge substrate, an upper bridge chip, a lower bridge chip, an output electrode, and a signal transmission terminal stacked in sequence. The upper bridge chip has a collector connected to the upper bridge substrate, and an emitter connected to the output electrode. The lower bridge chip has a collector connected to the output electrode. A sampling terminal at the emitter of the upper bridge chip, a sampling terminal at a collector of the upper bridge chip and a control terminal of the upper bridge chip, and a sampling terminal at an emitter of the lower bridge chip, a sampling terminal at a collector of the lower bridge chip, and a control terminal of the lower bridge chip are all connected to the signal transmission terminal.

18 Claims, 11 Drawing Sheets

(51) Int. Cl.

| | |
|---|---|
| ***H10W 70/60*** | (2026.01) |
| ***H10W 70/65*** | (2026.01) |
| ***H10W 74/10*** | (2026.01) |
| ***H10W 90/00*** | (2026.01) |
| *H10W 74/00* | (2026.01) |

(52) U.S. Cl.

CPC ....... *H10W 70/658* (2026.01); *H10W 74/127* (2026.01); *H10W 90/00* (2026.01); *H10W 90/701* (2026.01); *H10W 90/724* (2026.01); *H10W 74/00* (2026.01); *H10W 90/752* (2026.01); *H10W 90/753* (2026.01)

(58) Field of Classification Search

CPC ............. H10W 70/658; H10W 70/611; H10W 40/255; H10W 90/701

See application file for complete search history.

(56) References Cited

U.S. PATENT DOCUMENTS

| | | | |
|---|---|---|---|
| 2014/0284765 | A1 | 9/2014 | Kiuchi et al. |
| 2015/0255423 | A1 | 9/2015 | Lin et al. |
| 2018/0182688 | A1 | 6/2018 | Hanada |

FOREIGN PATENT DOCUMENTS

| | | | |
|---|---|---|---|
| CN | 107146775 | A | 9/2017 |
| CN | 107170714 | A | 9/2017 |
| CN | 107170720 | A | 9/2017 |
| CN | 110890337 | A | 3/2020 |
| CN | 210403710 | U | 4/2020 |
| EP | 3621106 | A4 | 5/2020 |
| JP | 2019125721 | A | 7/2019 |
| JP | 2020170826 | A | 10/2020 |
| WO | 2014046058 | A1 | 3/2014 |

* cited by examiner

PACKAGE MODULE WITH A PLURALITY OF STACKED SUBSTRATES HAVING MULTIPLE POWER CHIPS

CROSS-REFERENCE TO RELATED APPLICATIONS

The present application is a continuation application of PCT application No. PCT/CN2021/141373 filed on Dec. 24, 2021, which claims the priority of the Chinese patent application No. 202011565454.5 entitled "POWER MODULE" filed with the China National Intellectual Property Administration on Dec. 25, 2020, content of all of which is incorporated herein by reference in its entirety.

TECHNICAL FIELD

The present disclosure relates to the field of electronic technology and, more particularly, to a power module.

BACKGROUND

The existing half bridge structure packages can be mainly classified into three forms, i.e., a half bridge structure formed by individual transistors connected in series, a half bridge structure module with single-sided heat dissipation, and a half bridge structure module with double-sided heat dissipation. However, the chip junction temperature of these structures is relatively high, which can affect the reliability of the chips.

SUMMARY

The present disclosure aims to provide a power module that can effectively reduce the packaging volume and the chip temperature. Due to the reduced packaging volume of the power module provided in the present disclosure, more packages can be installed in the same system, thereby increasing system power. Furthermore, due to the decrease in chip temperature, it can effectively improve the reliability of the power module and system.

According to one aspect of the present disclosure, a power module is provided. The power module includes a positive input electrode, a negative input electrode, an upper bridge substrate, a lower bridge substrate, an upper bridge chip, a lower bridge chip, an output electrode, and a signal transmission terminal. The upper bridge substrate, the upper bridge chip, the lower bridge chip, and the lower bridge substrate are stacked in sequence. The upper bridge chip has a collector connected to the upper bridge substrate, and an emitter connected to the output electrode. The lower bridge chip has a collector connected to the output electrode. A sampling terminal at the emitter of the upper bridge chip, a sampling terminal at the collector of the upper bridge chip and a control terminal of the upper bridge chip, and a sampling terminal at an emitter of the lower bridge chip, a sampling terminal at the collector of the lower bridge chip, and a control terminal of the lower bridge chip are all connected to the signal transmission terminal. The positive input electrode is connected to the upper bridge substrate, and the negative input electrode is connected to the lower bridge substrate.

By adopting the above technical solution, the stacked arrangement of the upper bridge chip, the upper bridge buffer block, and the lower bridge chip can reduce a packaging volume of the power module, increase a system power, reduce the parasitic inductance of the power module (for example, under the same power output, the parasitic inductance of the packaging structure formed by vertical stacking according to the embodiment of the present disclosure can be within 5 nH, while the inductance of the existing packaging structure exceeds 10 nH), improve the overcurrent capacity of the power module and increase the heat dissipation area of the power module, and thus can effectively reduce chip temperature and effectively improve the reliability of the power module and the system.

Other features and advantages of the present disclosure will be explained in detail in the following specific description of specific embodiments.

BRIEF DESCRIPTION OF DRAWINGS

The accompanying drawings are intended to provide a further understanding of the present disclosure and form a part of the description. The accompanying drawings are used to explain the present disclosure, but do not constitute a limitation on the present disclosure. In the accompanying drawings.

DESCRIPTION OF REFERENCE NUMERALS

1: Lower bridge heat dissipation baseplate; 2: Welded or sintered connection layers between a heat dissipation base plate and a substrate, between a substrate and a chip, between a chip and a buffer block, between a buffer block and an electrode, and between a buffer block and a substrate; 3: Lower bridge substrate; 4: Lower bridge buffer block; 5: Lower bridge chip; 6: Output electrode; 7: Upper bridge buffer block; 8: Bridge chip; 9: Upper bridge substrate; 10: Upper bridge heat dissipation baseplate; 11: Positive input electrode; 12: Negative input electrode; 13: Thermistor terminal; 14: Bonding wire; 15: Thermistor; 16: Signal transmission terminal; 17: Plastic packaging shell; 18: Upper bridge sealing ring; 19: Upper bridge heat dissipation water channel; 20: Lower bridge sealing ring; 21: Lower bridge heat dissipation water channel; 23: Two-in-one water channel; 24: Driving board.

DESCRIPTION OF EMBODIMENTS

Specific embodiments of the present disclosure will be described in detail with reference to the accompanying drawings. It should be understood that the specific embodiments described here are only for the purpose of illustrating and explaining the present disclosure, and are not intended to limit the present disclosure.

The existing half-bridge structure packaging mainly has the following three forms.

1) Half bridge structure formed by individual transistors connected in series. In an individual transistor, a lower surface of a chip of the transistor, i.e., collector C, is welded to a substrate, an upper surface of the chip, i.e., emitter E, is wire-bonded to the substrate, and a gate G of the chip is connected to these electrodes through bonding, so as to complete the structural packaging. Finally, the packaged modules are electrically connected in series to form a half bridge structure with single-sided heat dissipation.

2) Half bridge structure module with single-sided heat dissipation. An electrical isolation among electrodes of upper and lower bridge arms is formed by using grooves in the substrate. The lower surface of the chip, i.e., collector C, is welded to the substrate, the upper surface of the chip, i.e. emitter E, is wire-bonded to the substrate, and the gate G of the chip is bonded to these electrodes to complete the structural packaging. At the same time, a connection between the upper bridge arm E and the lower bridge arm C is completed through bonding, forming a half bridge structure with single-sided heat dissipation.

3) Half bridge structure module with double-sided heat dissipation. The lower surface of the chip, i.e., collector C, is welded to the substrate, the upper surface of the chip, i.e., emitter E, is welded to a copper block, and the copper block is then welded to the substrate, the chip gate G is bonded to the electrodes to complete the structural packaging, thereby forming a half bridge structure with double-sided heat dissipation.

Figure 1:
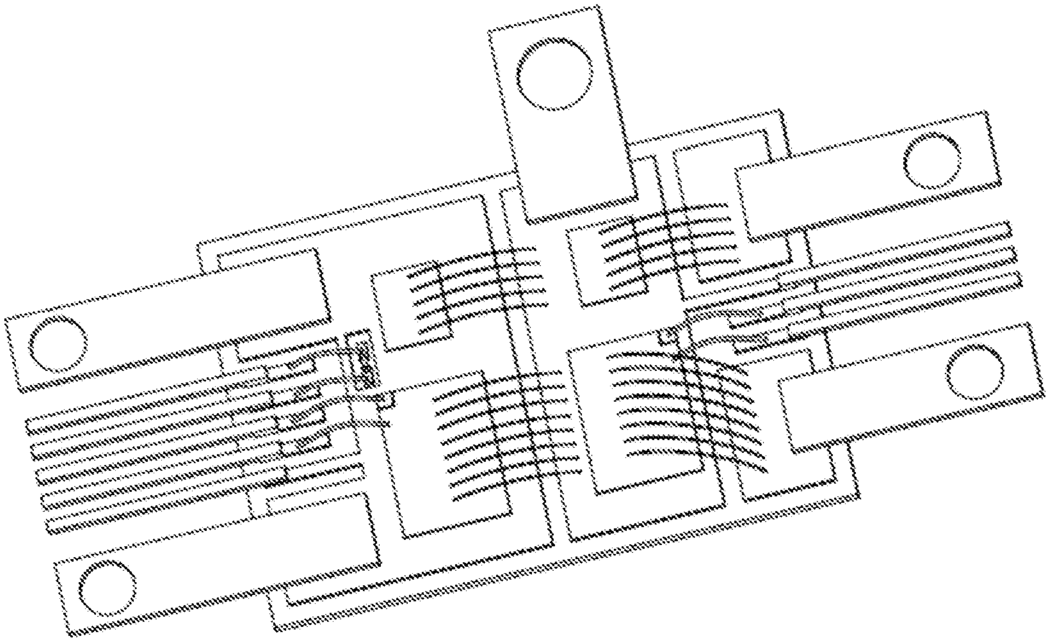
FIG. 1 (Prior Art)
FIG. 1 is a schematic diagram of a package for half bridge structure based on prior art.

However, the main electrodes of these packaged structures all have planar design structures. That is, the input and output electrodes are on a same plane as the substrate surface, and the upper and lower bridge chips are also arranged in a same plane, as shown in FIG. 1. The main drawback of these structures lies in a high parasitic inductance, which can lead to a high chip junction temperature and thus affect the reliability of the module.

The existing modularized heat dissipation structures mainly include the following three types: 1) a flat plate on single side, that is to say, a substrate is connected to a baseplate, and is installed on a heat sink, so as to dissipate heat through the flat baseplate; 2) pinfins on single side, that is to say, a substrate is connected to a baseplate with pinfins, and is installed on a heat sink to dissipate heat through the baseplate with pinfins; 3) double-sided heat dissipation without any baseplate, that is to say, a substrate is directly installed on a heat sink so as to dissipate the heat through the substrates on both sides.

The above three types of packaging all adopt a planar and lateral connection structure to form a half bridge packaged form in which upper and lower bridges are connected. In the module having individual transistors, individual transistors are connected in series and parallel so as to form a required half bridge or another circuit structure. In an integrated module, multiple chips are disposed on a substrate and are connected in series and parallel to form a required circuit structure. Both the connection among individual transistors and the bonding-wire connection among chips will increase the parasitic inductance and reduce the overcurrent capacity. Moreover, due to the fact that the upper and lower bridge chips are packaged on a same plane, the packaging volume of the module is relatively large, and the heat dissipation surface is relatively single, resulting in poor reliability performance. In addition, in the existing main electrode layout of the miniaturized modular design, the main electrodes are very close to each other, which causes a safety distance hazard and cannot meet the requirements of high-voltage applications. The existing heat dissipation structures in the module have a relatively low heat dissipation performance, and cannot meet the requirements for a higher power density and more efficient heat dissipation in the high-temperature operation.

Figure 2:
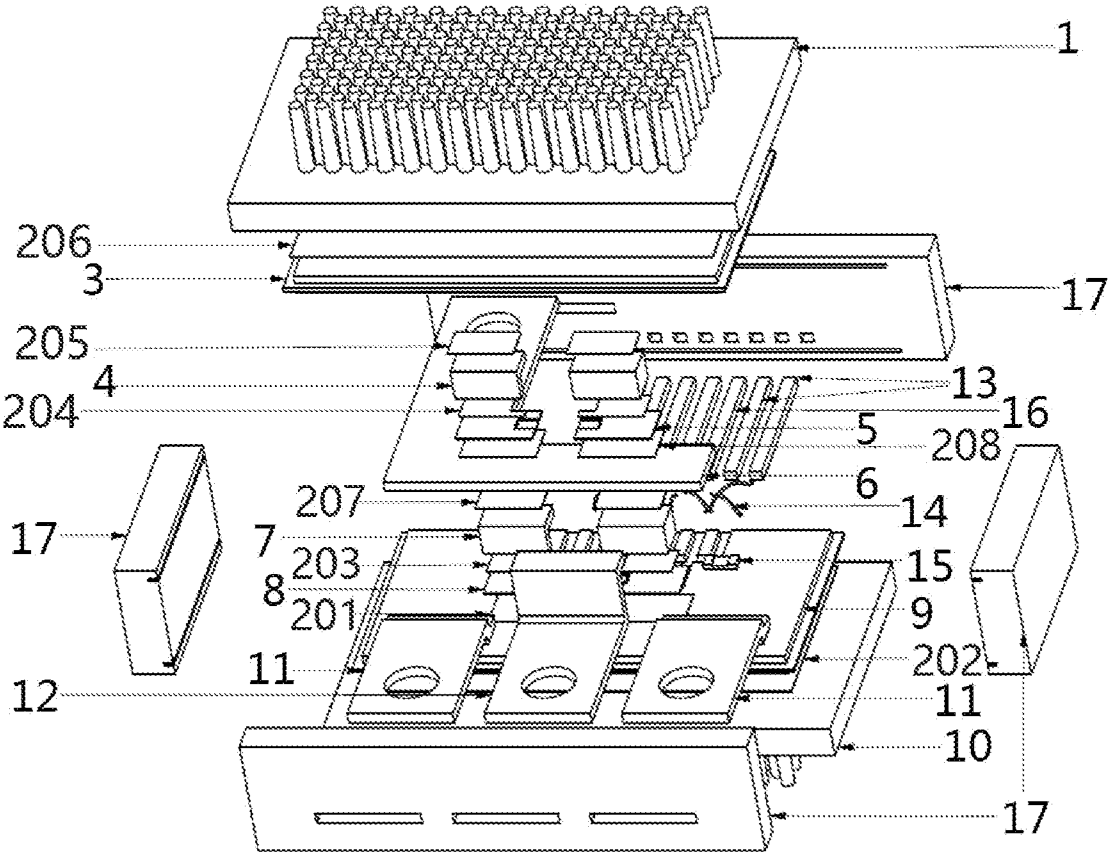
FIG. 2 is a schematic diagram of a power module according to an embodiment of the present disclosure.

FIG. 2 is a schematic diagram of a power module according to an embodiment of the present disclosure. As shown in FIG. 2, the power module includes an upper bridge chip 8, an upper bridge buffer block 7, a lower bridge chip 5, an output electrode 6, a thermistor 15, a bonding wire 14, a signal transmission terminal 16, and a thermistor terminal 13. The upper bridge chip 8, the upper bridge buffer block 7, and the lower bridge chip 5 are stacked. The upper bridge chip 8 has an emitter that is connected to the output electrode 6 through the upper bridge buffer block 7, and the lower bridge chip 5 has a collector that is connected to the output electrode 6. A sampling terminal at the emitter of the upper bridge chip 8, a sampling terminal at a collector of the upper bridge chip 8, and a control terminal of the upper bridge chip 8, and a sampling terminal at an emitter of the lower bridge chip 5, a sampling terminal at the collector of the lower bridge chip 5, and a control terminal of the lower bridge chip 5 are all connected to the signal transmission terminal 16 through their respective bonding wires 14. The thermistor 15 is connected to the thermistor terminal 13 through its bonding wire 14. The terms "upper" and "lower" mentioned here are relative terms. In the embodiment of the present disclosure, a front side (the emitter E/source S) of the upper bridge chip 8 and a back side (the collector C/drain D) of the lower bridge chip 5 must be connected to the same output electrode 6, and the upper bridge chip 8 and the lower bridge chip 5 are not on a same plane, e.g., are disposed at two opposite sides of the output electrode 6.

Here, the signal transmission terminal 16 is used for signal transmission and reception, and its uses include but are not limited to control, sampling, etc. In the embodiment of FIG. 2, the signal transmission terminal 16 is a collection of control terminals and sampling terminals. For example, both the upper bridge chip 8 and the lower bridge chip 5 have control terminals, the signal transmission terminal 16 will therefore include two control terminals, and others in a similar fashion.

Similarly, the bonding wire 14 here is a collection of all bonding wires, including e.g., a bonding wire connecting the sampling terminal at the emitter of the upper bridge chip 8 to the signal transmission terminal 16, a bonding wire leading out from the sampling terminal at the emitter of the lower bridge chip 5 to the signal transmission terminal 16, and so on.

The upper bridge buffer block 7 here serves as an electrical connection, increases the heat capacity of the heat dissipation path to improve heat dissipation efficiency, and provides space for the bonding wire to lead out. For example, the upper bridge buffer block 7 can be a copper block, a molybdenum block, and so on. Other buffer blocks described below have similar functions to those of the upper bridge buffer block 7. Those skilled in the art can understand that a buffer block doesn't completely attach to a corresponding chip. That is, a buffer block is only in contact with a corresponding chip at a necessary position e.g., a position where an electrode is disposed, and a clearance between the buffer block and the corresponding chip should be left at a position where the buffer block and the corresponding chip are not in contact with each other according to the circuit layout.

In addition, for the convenience of description, three terminals of each of the upper bridge chip 8 and the lower bridge chip 5 are described as an emitter, a collector, and a control terminal in this disclosure. However, those skilled in the art should understand that the upper bridge chip 8 and the lower bridge chip 5 can be devices of IGBT type, devices of MOS type, or other types of devices.

By adopting the above technical solution, the stacked arrangement of the upper bridge chip 8, the upper bridge buffer block 7, and the lower bridge chip 5 can reduce a packaging volume of the power module, increase a system power, reduce the parasitic inductance of the power module (for example, under the same power output, the parasitic inductance of the packaged structure formed by vertical stacking according to the embodiment of the present disclosure can be within 5 nH, while the inductance of the existing packaged structure exceeds 10 nH), improve the overcurrent capacity of the power module and increase the heat dissipation area of the power module, and thus can effectively reduce chip temperature and effectively improve the reliability of the power module and the system.

With reference to FIG. 2, the power module according to the embodiment of the present disclosure further includes a positive input electrode 11, a negative input electrode 12, a first connection layer 201, an upper bridge substrate 9, a second connection layer 202, an upper bridge heat dissipation baseplate 10, a third connection layer 203, a fourth connection layer 204, a lower bridge buffer block 4, a fifth connection layer 205, a lower bridge substrate 3, a sixth connection layer 206, and a lower bridge heat dissipation baseplate 1. The upper bridge heat dissipation baseplate 10, the upper bridge substrate 9, and the upper bridge chip 8, the upper bridge buffer block 7, the lower bridge chip 5, the lower bridge buffer block 4, the lower bridge substrate 3, and the lower bridge heat dissipation baseplate 1 are stacked in a direction perpendicular to the chips.

The collector of the upper bridge chip 8 is connected to the upper bridge substrate 9. The upper bridge substrate 9 is connected to the upper bridge heat dissipation baseplate 10 through the second connection layer 202. The upper bridge chip 8 is connected to the upper bridge buffer block 7 through the third connection layer 203. The emitter of the lower bridge chip 5 is connected to the lower bridge buffer block 4 through the fourth connection layer 204. The lower bridge buffer block 4 is connected to the lower bridge substrate 3 through the fifth connection layer 205, and the lower bridge substrate 3 is connected to the lower bridge heat dissipation baseplate 1 through the sixth connection layer 206. Optionally, the collector of the upper bridge chip 8 is connected to the upper bridge substrate 9 through the first connection layer 201. For example, the first to sixth connection layers mentioned above are corresponding connection layers e.g., welded or sintered connection layers between a corresponding heat dissipation base plate and a corresponding substrate, between a corresponding substrate and a corresponding chip, between a corresponding chip and a corresponding buffer block, between a corresponding buffer block and a corresponding electrode, and between a corresponding buffer block and a corresponding substrate, and are used for connecting the various components mentioned above and contribute to heat dissipation.

The upper bridge heat dissipation baseplate 10 and the lower bridge heat dissipation baseplate 1 can be heat dissipation base plates with Pin-Fins or other types of heat dissipation baseplates.

Figure 3:
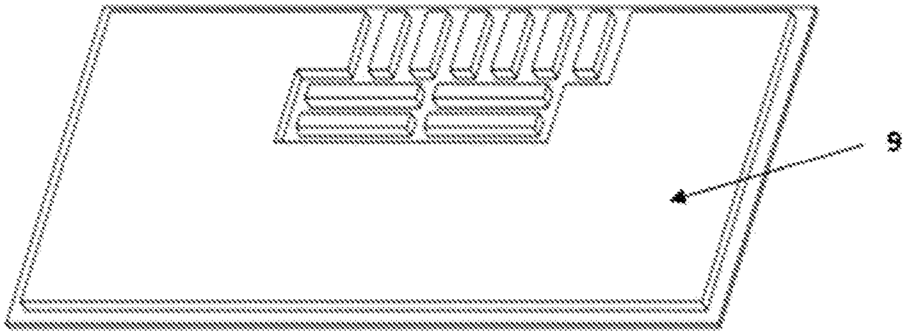
FIG. 3 is a schematic diagram of an upper bridge substrate.

The upper bridge substrate 9 and the lower bridge substrate 3 both can be ceramic substrates, such as copper-clad ceramic substrates (such as copper-clad aluminum nitride ceramic substrates, copper-clad aluminum oxide ceramic substrates, etc.), active metal brazed ceramic substrates, etc. The thickness of each of the upper and lower copper cladding of the ceramic substrate is adjustable. FIG. 3 shows a schematic diagram of the upper bridge substrate 9.

Figure 4:
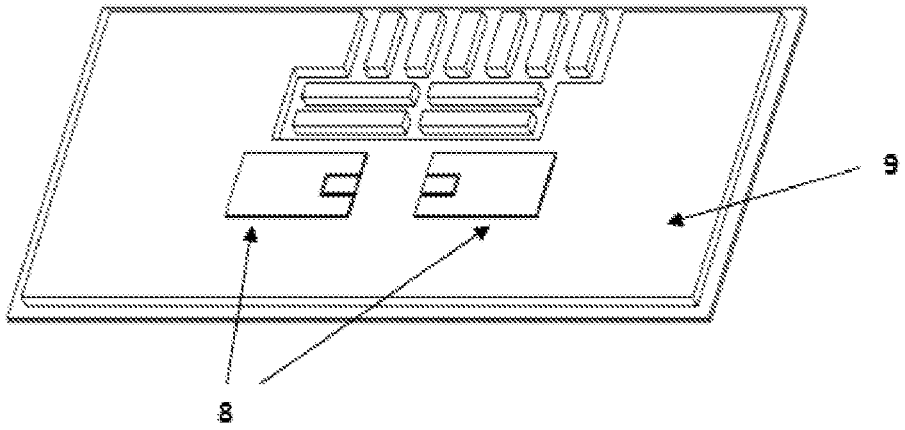
FIG. 4 is a schematic diagram showing a connection between a collector of an upper bridge chip and an upper bridge substrate.

As shown in FIG. 4, the collector of the upper bridge chip 8 is welded or sintered onto the upper bridge substrate 9.

Figure 5:
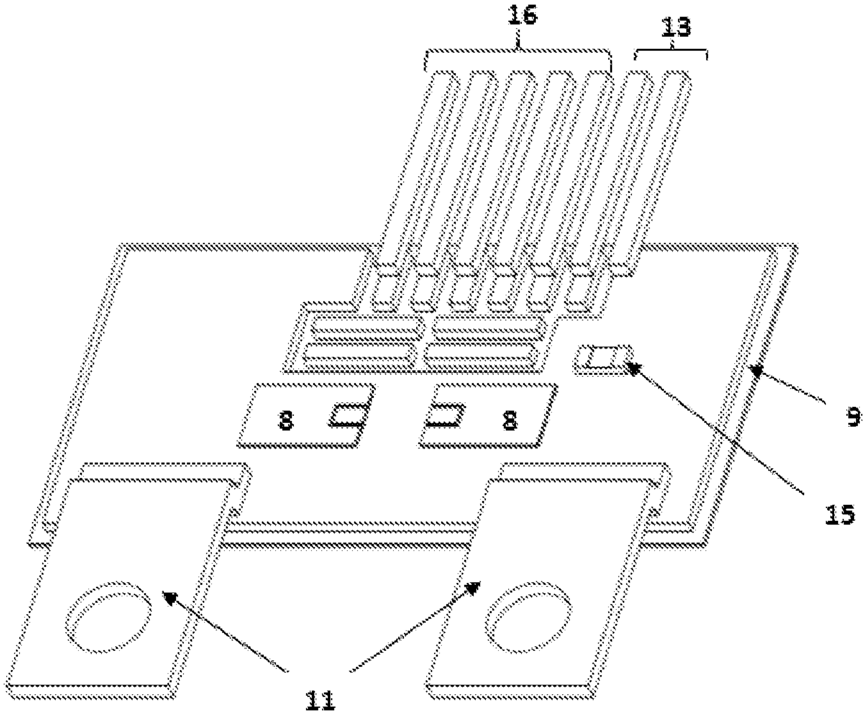
FIG. 5 is a schematic diagram showing connections among a thermistor, a thermistor terminal, a signal transmission terminal, an positive input electrode of the power module and an upper bridge substrate.

As shown in FIG. 5, the thermistor 15, the thermistor terminal 13, the signal transmission terminal 16, and the positive input electrode 11 of the power module are welded or sintered onto the upper bridge substrate 9.

Figure 6:
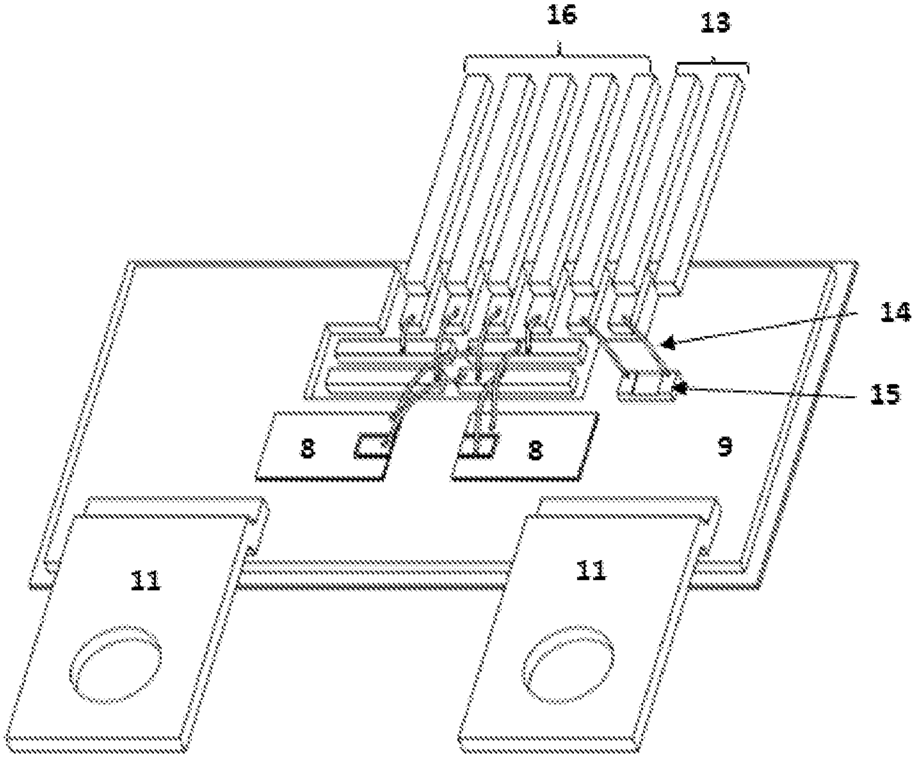
FIG. 6 is a schematic diagram showing bonding lines.

FIG. 6 shows a schematic diagram of the bonding lines 14. As shown in FIG. 6, the sampling terminals at the emitter and the collector of the upper bridge chip 8, and the control terminal of the upper bridge chip 8 are respectively connected to the signal transmission terminal 16 through their respective bonding wires 14. The thermistor 15 is connected to the thermistor terminal 13 through its bonding wire 14.

Figure 7:
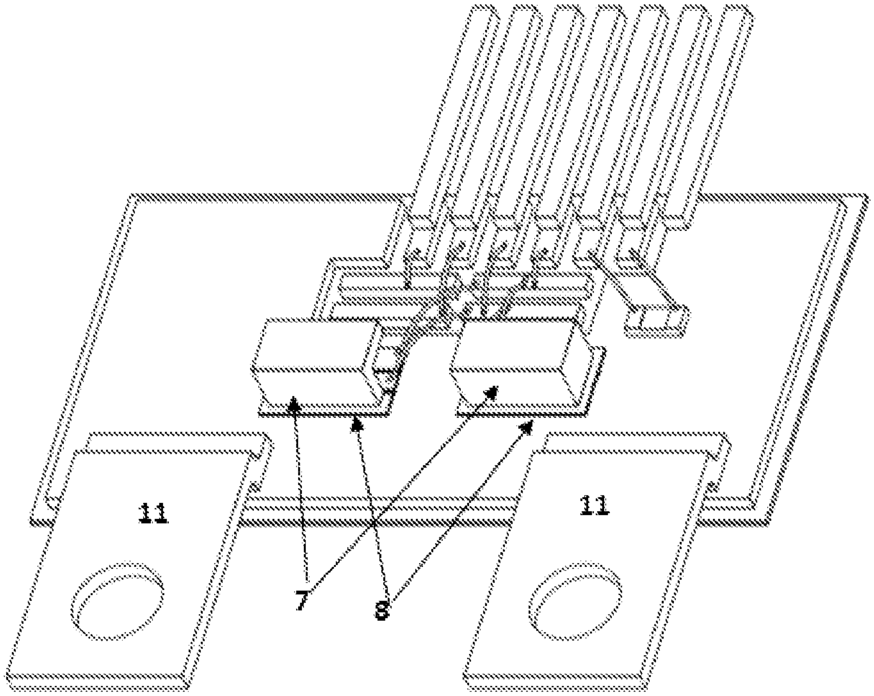
FIG. 7 is a schematic diagram showing a connection between an upper bridge buffer block and an emitter of an upper bridge chip.

As shown in FIG. 7, the upper bridge buffer block 7 is welded or sintered onto the emitter of the upper bridge chip 8. This increases the heat dissipation area, which is more conducive to the heat dissipation of the upper bridge chip.

Figure 8:
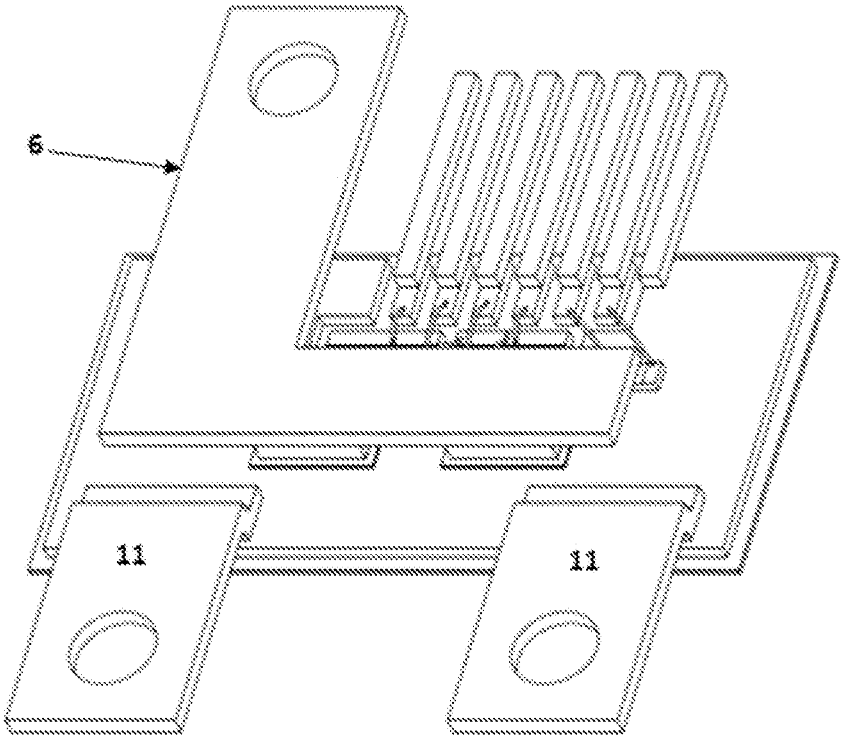
FIG. 8 is a schematic diagram showing a connection between an output electrode and an upper bridge buffer block.

As shown in FIG. 8, the output electrode 6 is welded or sintered onto the upper bridge buffer block 7.

Figure 9:
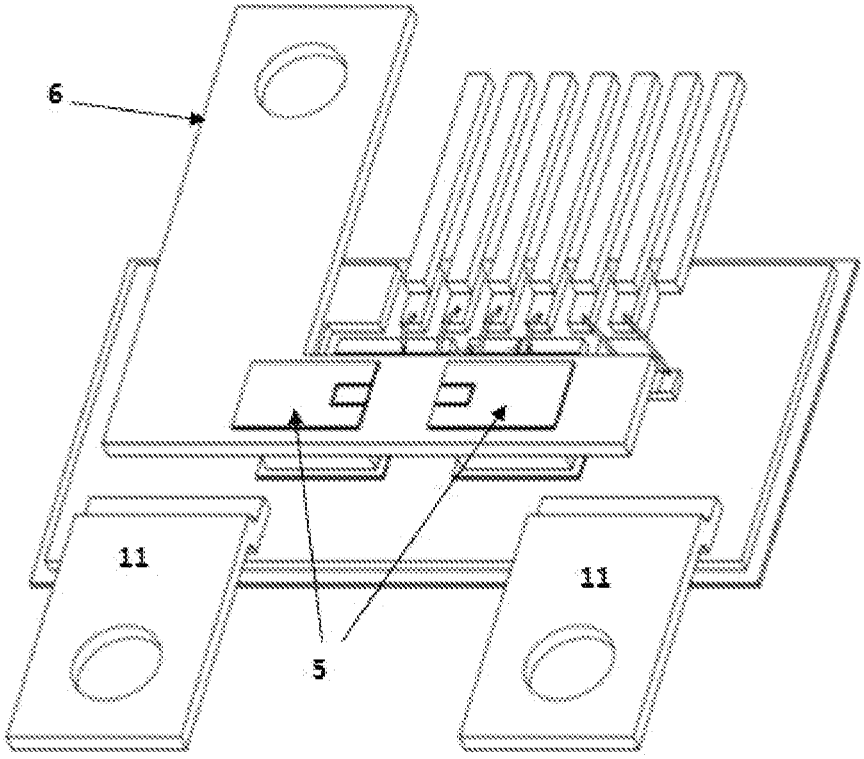
FIG. 9 is a schematic diagram showing a connection between a collector of a lower bridge chip and an output electrode.
Figure 10:
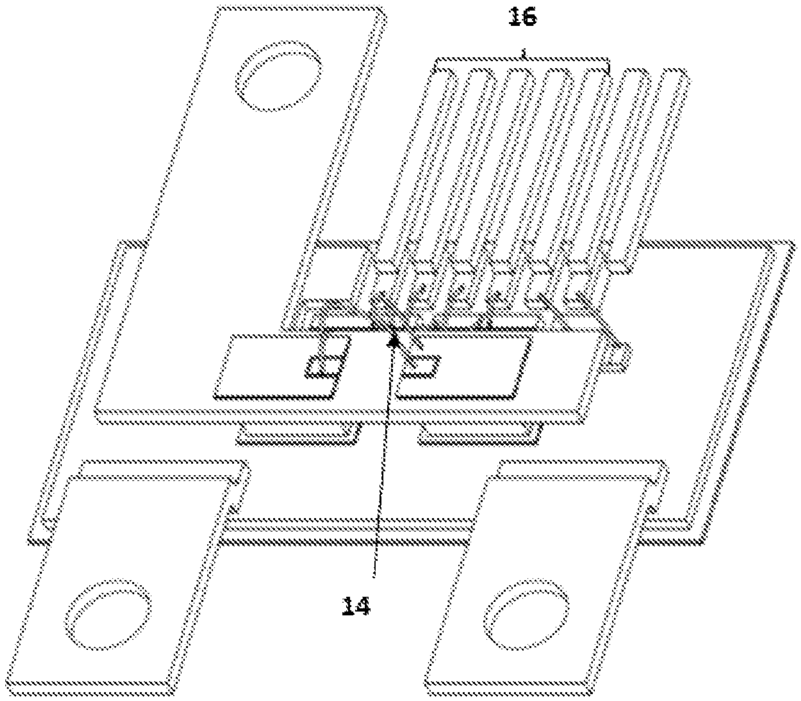
FIG. 10 is a schematic diagram showing connections among a control line, a sampling line of a lower bridge chip, and a signal transmission terminal.

As shown in FIG. 9, the collector of the lower bridge chip 5 is welded or sintered onto the output electrode 6. In this way, a vertical path for the upper and lower bridges is formed, which significantly reduces the circuit inductance. FIG. 10 shows a schematic diagram of the connection among the control terminal and the sampling terminals of the lower bridge chip 5, and the signal transmission terminal 16. That is, the control terminal and the sampling terminals (i.e. the sampling terminal at the collector, and the sampling terminal at the emitter) of the lower bridge chip 5 are connected to the signal transmission terminal 16 through a bonding wire 14.

Figure 11:
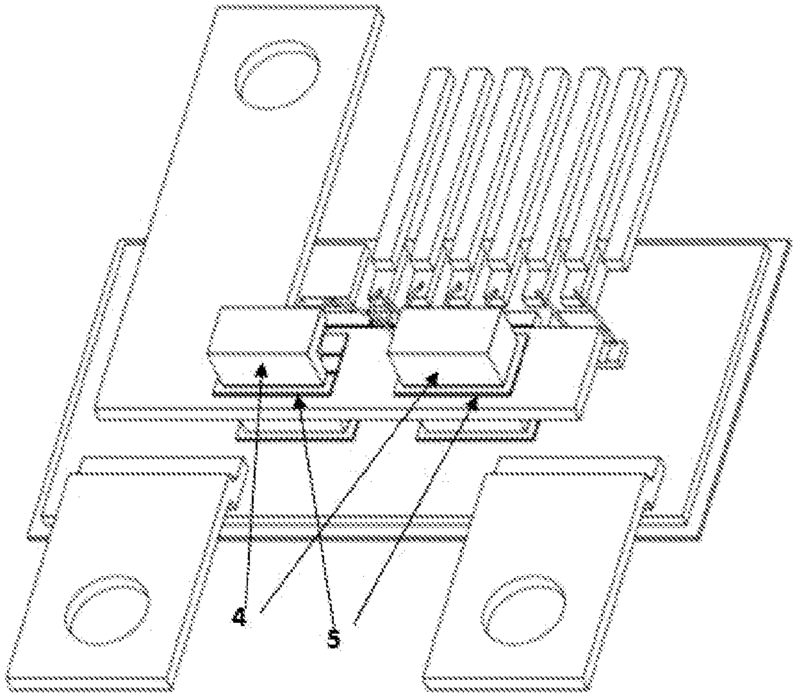
FIG. 11 is a schematic diagram showing a connection between a lower bridge buffer block and an emitter of a lower bridge chip.

As shown in FIG. 11, the lower bridge buffer block 4 is welded or sintered onto the emitter of the lower bridge chip 5, which increases the heat dissipation area and is more conducive to the heat dissipation of the lower bridge chip.

Figure 12:
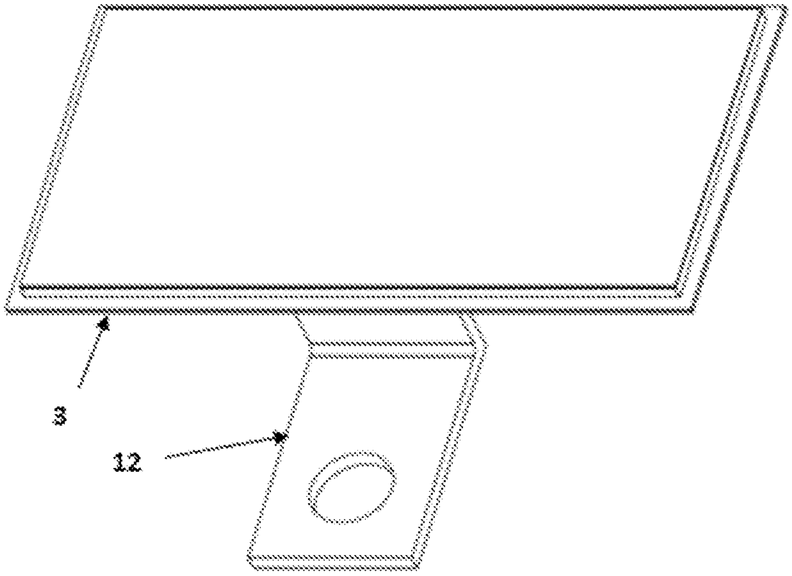
FIG. 12 is a schematic diagram showing a connection between an negative input electrode of a power module and a lower bridge substrate.

As shown in FIG. 12, the negative input electrode 12 of the power module is welded or sintered onto the lower bridge substrate 3.

Figure 13:
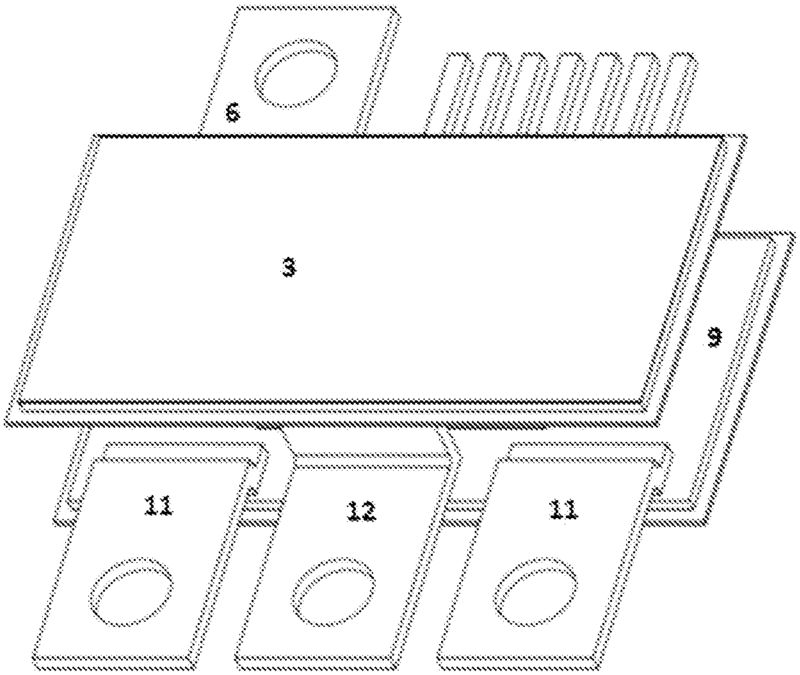
FIG. 13 is a schematic diagram showing a connection between a lower bridge substrate and a lower bridge buffer block.

As shown in FIG. 13, the lower bridge substrate 3 is welded or sintered onto the lower bridge buffer block 4.

Figure 14:
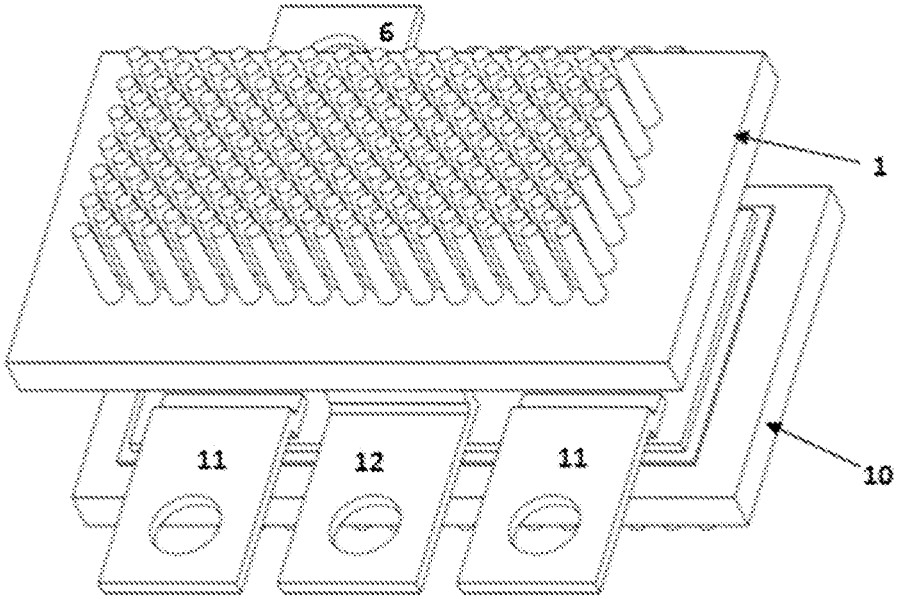
FIG. 14 is a schematic diagram showing a connection between a upper bridge heat dissipation baseplate and a upper bridge substrate, and a connection between a lower bridge heat dissipation baseplate and a lower bridge substrate.

As shown in FIG. 14, a back side of the upper bridge substrate 9 and a back side of the lower bridge substrate 3 are respectively welded or sintered to the upper bridge heat dissipation baseplate 10 and the lower bridge heat dissipation baseplate 1. This double-sided heat dissipation baseplate structure significantly increases the heat dissipation area and improves heat dissipation efficiency. The term "back side" mentioned here refers to the side of the substrate that is not characterized by circuit components, or is also known as a non-component side. Correspondingly, a side of the circuit component that is characterized by circuit components is called the front side of the substrate, or a component side.

Figure 15:
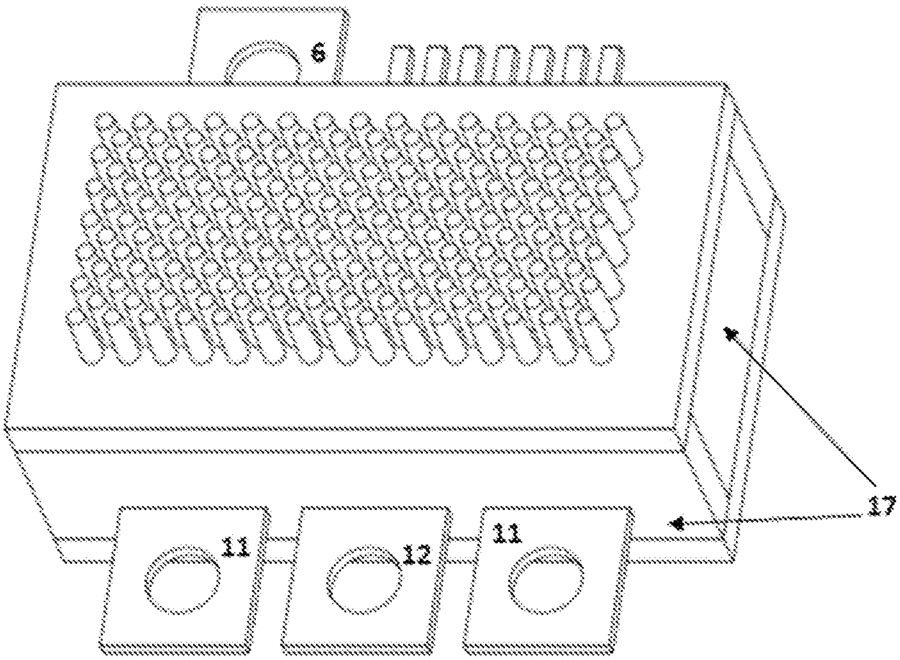
FIG. 15 is a schematic diagram showing a plastic packaged power module.

FIG. 15 shows a schematic diagram of a plastic packaged power module. A plastic packaging shell 17 can provide protection and mechanical support for the module. The high-temperature working characteristics of the plastic packaging can significantly improve the application environment of the module.

It can be obtained from the above description that, in the structures in the prior art, chips connected in series are arranged horizontally, and the current passes vertically through a chip and then flows horizontally through a connecting part. The power module according to the embodiment of the present disclosure however has a vertical transmission structure. In this way, chips are stacked in layers to shorten the current flow path, and the current flows vertically, thereby greatly reducing the parasitic inductance of the circuit. At the same time, the chips can form a stacked structure together with substrates and buffer blocks, and heat generated by the chips can be dissipated through multiple substrates and buffer blocks, thereby greatly improving the heat dissipation efficiency, achieving a lower operating temperature of the chips under a same working condition and thus significantly improving the reliability and extending service life of the power module. In addition, the power module is provided with heat dissipation baseplates on both sides thereof, which can efficiently dissipate heat via double-sided heat dissipation during application, significantly reduce the operation temperature of chips and improve the operational reliability and service life of the chip. Furthermore, in the heat dissipation baseplate structure, the substrate is connected to the heat dissipation baseplate through welding or sintering, which can significantly reduce the thermal resistance between the substrate and the heat dissipation baseplate. Additionally, since a heat dissipation structure is provided on both sides of the power module, the heat dissipation efficiency can be further improved and a heat dissipation foundation can be provided for a packaged module that is miniaturized.

Figure 16:
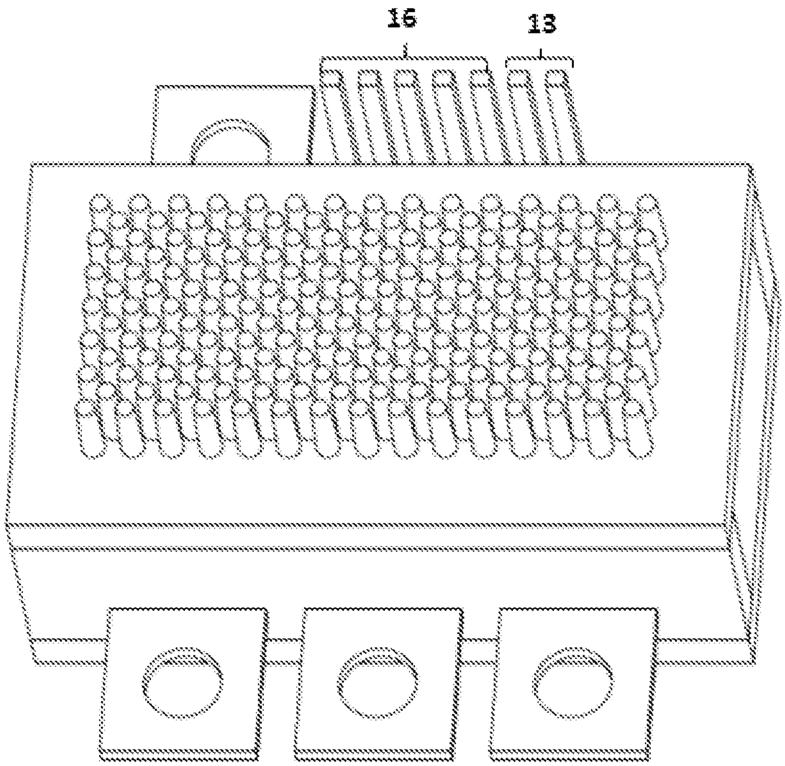
FIG. 16 is a schematic diagram showing another plastic packaged power module.

FIG. 16 shows a schematic diagram of another plastic packaged power module. As shown in the structure of FIG. 16, the thermistor terminal 13 and the signal transmission terminal 16 both have bent structures. For example, they can be bent at 90 degrees in a bending direction that is not limited, thereby allowing for a practical matching based on the heat dissipation water channel and the application environment. That is to say, the thermistor terminal 13 and the signal transmission terminal 16 can be bent into a shape that matches the shape of the heat dissipation water channel, for example. Therefore, during assembly, the bent structures of the thermistor terminal 13 and the signal transmission terminal 16 can be fit to the shape of a region of the heat dissipation water channel that is in contact with the bent structures of the thermistor terminal 13 and the signal transmission terminal 16, thereby saving installation space.

Figure 17:
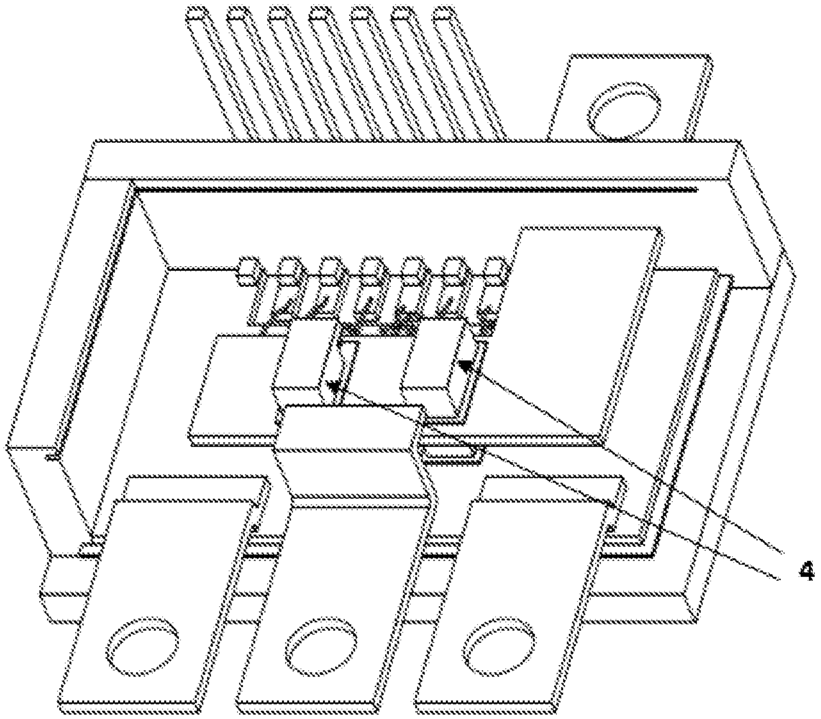
FIG. 17 is a schematic diagram of a power module according to another embodiment of the present disclosure.

FIG. 17 is a schematic diagram of a power module according to another embodiment of the present disclosure. As shown in FIG. 17, the upper bridge chip 8 and lower bridge chip 5 both are arranged in a longitudinal direction. On the contrary, in the previous embodiments, the upper bridge chip 8 and lower bridge chip 5 both are arranged in a lateral direction. In this disclosure, the term "lateral direction" refers to the left-right direction of the power module in FIG. 17, and the term "longitudinal direction" refers to the front-rear direction of the power module in FIG. 17. With the arrangement in the longitudinal direction mentioned above, it can place more upper bridge chips 8 and more lower bridge chips 5 in the left-right direction without changing the packaging volume, thus providing the possibility of increasing the output capacity.

Figure 18:
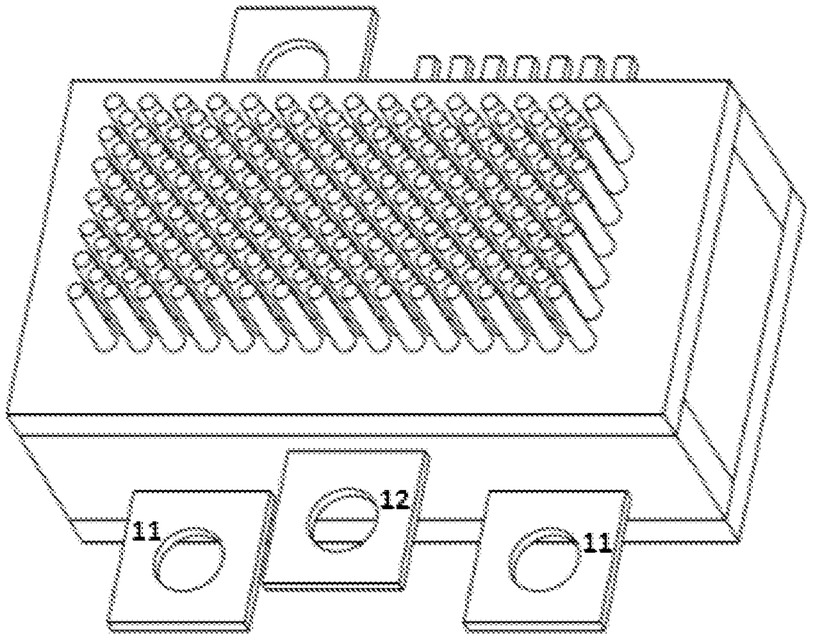
FIG. 18 is a schematic diagram of a power module according to yet another embodiment of the present disclosure.

FIG. 18 is a schematic diagram of a power module according to another embodiment of the present disclosure. As shown in FIG. 18, an installation plane of the positive input electrode 11 of the power module and an installation plane of the negative input electrode 12 of the power module are located on different horizontal planes. However, if the installation plane of the positive input electrode 11 and the installation plane of the negative input electrode 12 are located on the same horizontal plane, the spacing between the positive input electrode 11 and the negative input electrode 12 will be smaller. Therefore, by placing the installation plane of the positive input electrode 11 and the installation plane of the negative input electrode 12 on different horizontal planes, the distance between the positive input electrode 11 and the negative input electrode 12 is greatly increased, thereby increasing the safety distance and greatly improving the voltage safety level of the power module. Furthermore, a higher voltage safety level leads to a wider range of application voltage platforms, thereby making the power module according to the embodiment of the present disclosure suitable for more application scenarios. In this disclosure, the term "safety distance" refers to an aerial distance between the positive input electrode 11 and the negative input electrode 12.

Figure 19:
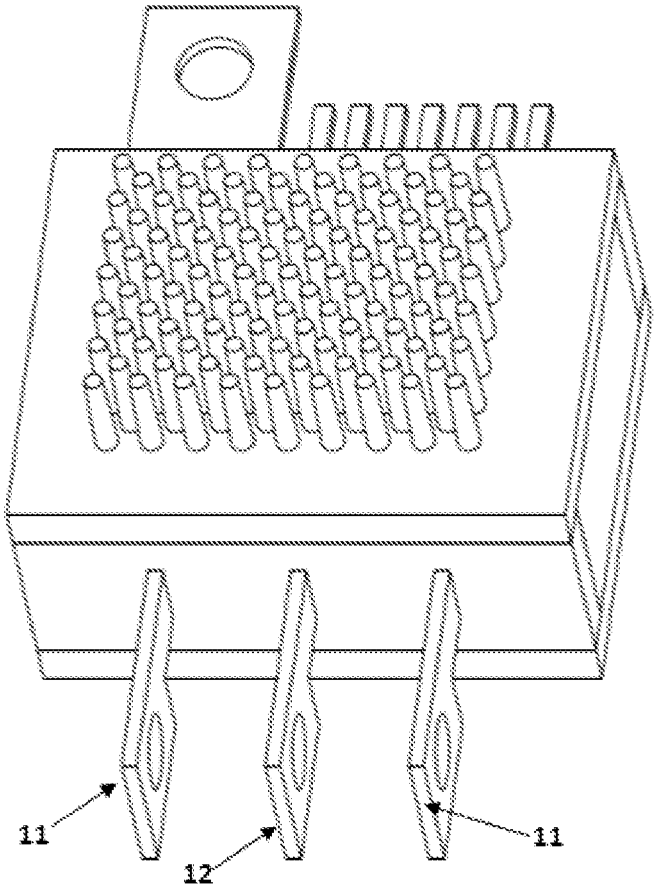
FIG. 19 is a schematic diagram of a power module according to still another embodiment of the present disclosure.

FIG. 19 is a schematic diagram of a power module according to another embodiment of the present disclosure. FIG. 19 is similar to FIG. 18, except that the installation plane of the positive input electrode 11 and the installation plane of the negative input electrode 12 are located on different planes and both are at a 90° angle to the horizontal plane. That is, as shown in FIG. 19, the installation plane of the positive input electrode 11 and the installation plane of the negative input electrode 12 both extend along a longitudinal direction, which increases the safety distance between the positive input electrode 11 and the negative input electrode, and improves the voltage safety level and the application voltage platform range of the power module.

Figure 20:
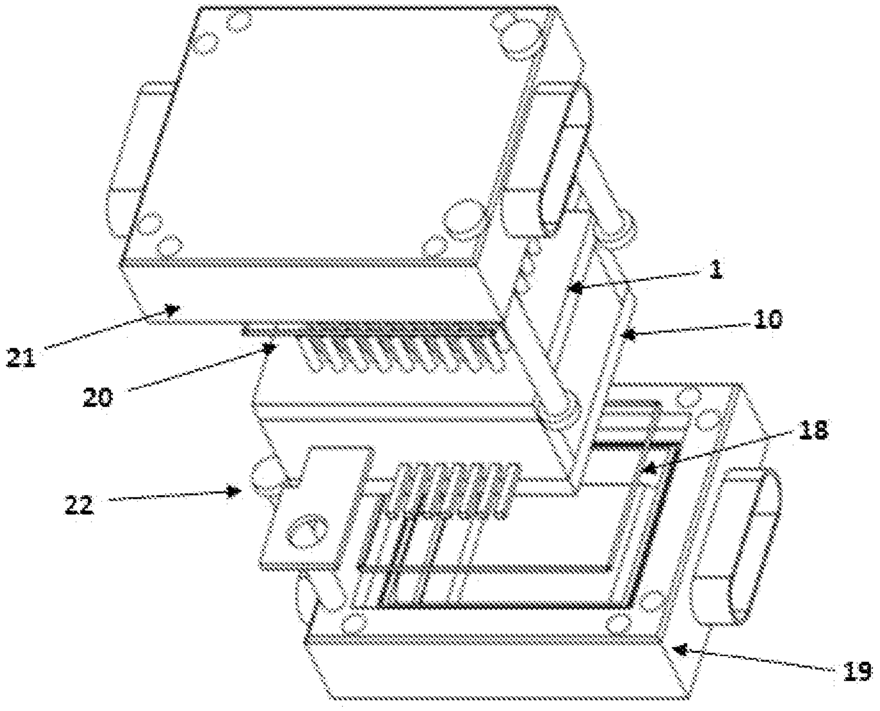
FIG. 20 is a schematic diagram of a power module according to another embodiment of the present disclosure.

FIG. 20 is a schematic diagram of a power module according to another embodiment of the present disclosure. As shown in FIG. 20, the power module according to the embodiment of the present disclosure further includes an upper bridge heat dissipation water channel 19 and a lower bridge heat dissipation water channel 21. The upper bridge heat dissipation baseplate 10 is mounted together with the upper bridge heat dissipation water channel 19, and the lower bridge heat dissipation baseplate 1 is mounted together with the lower bridge heat dissipation water channel 21. In an embodiment, the upper bridge heat dissipation baseplate 10 can be mounted to the upper bridge heat dissipation water channel 19 through an upper bridge sealing ring 18, the lower bridge heat dissipation baseplate 1 can be mounted to the lower bridge heat dissipation water channel 21 through a lower bridge sealing ring 20, and the upper bridge heat dissipation water channel 19 and the lower bridge heat dissipation water channel 21 are secured together by a fasteners (such as a screw). Through the heat dissipation water channels, heat dissipation can be achieved. Furthermore, through this configuration, the pin-fins on the heat dissipation baseplates can be in a direct contact with the cooling medium in the heat dissipation water channel, resulting in relatively high heat dissipation efficiency.

Figure 21:
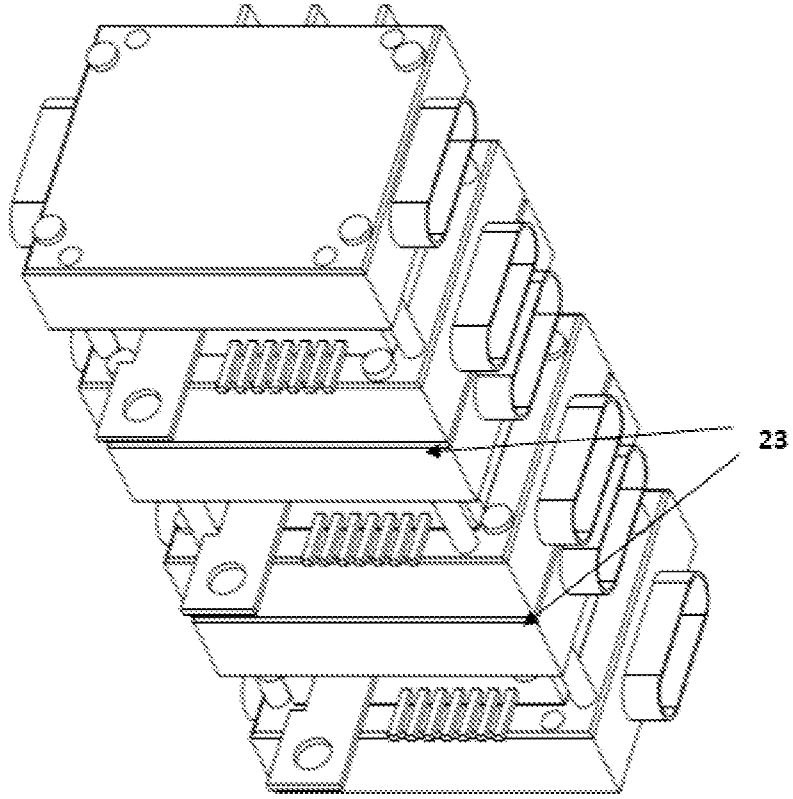
FIG. 21 is a schematic diagram of a power module according to another embodiment of the present disclosure.

FIG. 21 is a schematic diagram of a power module according to another embodiment of the present disclosure. The difference of FIG. 21 from FIG. 20 is that multiple power modules are stacked. In FIG. 21, the multiple power modules are stacked in a direction perpendicular to the chips. In this case, for two adjacent power modules, the lower bridge heat dissipation water channel 21 of a lower power module of the two adjacent power modules and the upper bridge heat dissipation water channel 19 of an upper power module of the two adjacent power modules form a two-in-one water channel 23. The two-in-one water channel 23 is an independent water channel internally divided into two independent water channel spaces that are respectively an independent upper water channel space and an independent lower water channel space, which are respectively used to dissipate heat from the heat dissipation baseplates on both sides thereof. Furthermore, these two independent water channel spaces do not affect each other with respect to heat dissipation. This arrangement can significantly reduce an installation volume of the power module and heat dissipation water channels, increase the power density and the system volume density. In addition, the various heat dissipation water channels mentioned in this disclosure can share a same water inlet and a same water outlet, but the internal spaces of the respective heat dissipation water channels are independent of each other. Of course, it is feasible to not share the water inlet and the water outlet.

Figure 22:
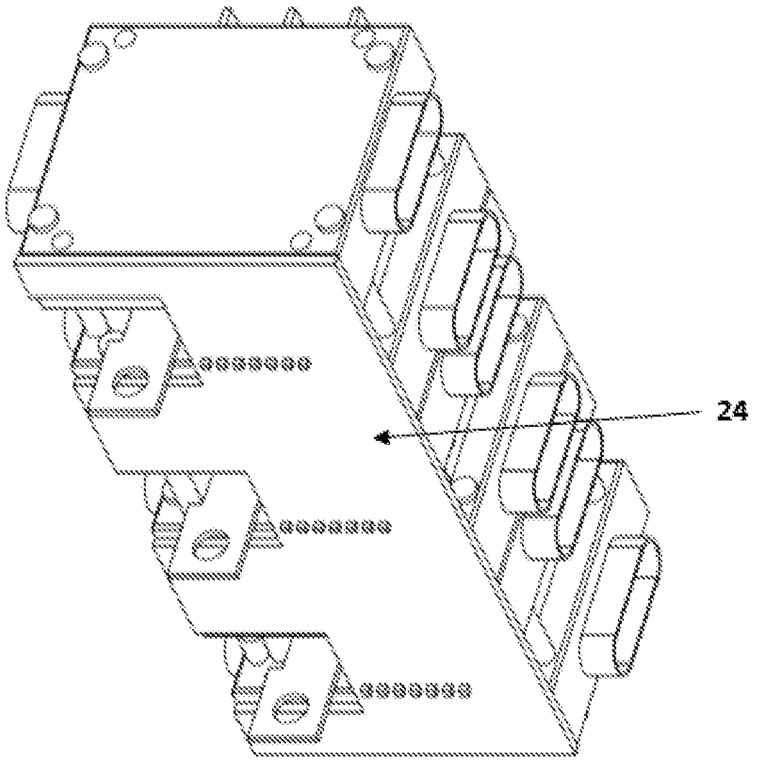
FIG. 22 is a schematic diagram of a power module according to another embodiment of the present disclosure.

FIG. 22 is a schematic diagram of a power module according to another embodiment of the present disclosure. As shown in FIG. 22, the power module according to the embodiment of the present disclosure further includes a driving board 24 configured to drive a three-phase bridge arm chip of the power module to be turned on or off. The driving board 24 is arranged on one side of the signal transmission terminal 16 where the control terminal is located, and an interface is reserved at a position of the driving board 24 where the control terminal is to be placed, so as to allow the control terminal to be connected to the drive board 24. At the same time, it is also necessary to avoid the position of the output electrode 6 so as to allow a wire to lead out. The driving board 24 can be arranged on a side of the upper bridge heat dissipation water channel 19 and the lower bridge heat dissipation water channel 21 described above, so that the driving board 24 can be integrated with the entire power module system without increasing the volume of the power module.

Certain embodiments of the present disclosure are described in detail above in conjunction with the accompanying drawings. However, the present disclosure is not limited to the specific details of the aforementioned embodiments. Within the scope of the technical concept of the present disclosure, multiple simple variations can be made to the technical solutions of the present disclosure, and these simple variations fall within the protection scope of the present disclosure.

Furthermore, it should be noted that the various specific technical features described in the above specific embodiments can be combined in any suitable way without contradiction. In order to avoid unnecessary repetition, various possible combinations are not separately explained in this disclosure.

In addition, various different embodiments of the present disclosure can be combined arbitrarily as long as they do not violate the ideas of the present disclosure, and they should also be considered as contents disclosed in the present disclosure.

The invention claimed is:

1. A power module, comprising:

a positive input electrode, a negative input electrode, an upper bridge substrate, a lower bridge substrate, an upper bridge chip, a lower bridge chip, an output electrode, and a signal transmission terminal, wherein the upper bridge substrate, the upper bridge chip, the lower bridge chip, and the lower bridge substrate are stacked in sequence, wherein:

the upper bridge chip has a collector connected to the upper bridge substrate, and an emitter connected to the output electrode, the lower bridge chip has a collector connected to the output electrode, a sampling terminal at the emitter of the upper bridge chip, a sampling terminal at the collector of the upper bridge chip, and a control terminal of the upper bridge chip, and a sampling terminal at an emitter of the lower bridge chip, a sampling terminal at the collector of the lower bridge chip, and a control terminal of the lower bridge chip are connected to the signal transmission terminal, the positive input electrode is connected to the upper bridge substrate, and the negative input electrode is connected to the lower bridge substrate, the power module further comprises an upper bridge buffer block and a third connection layer, and the upper bridge chip, the upper bridge buffer block, and the lower bridge chip are stacked, the upper bridge chip is connected to the upper bridge buffer block through the third connection layer, the emitter of the upper bridge chip is connected to the output electrode through the upper bridge buffer block.

2. The power module according to claim 1, further comprising:

a lower bridge buffer block, a fourth connection layer, and a fifth connection layer, wherein the upper bridge chip, the upper bridge buffer block, the lower bridge buffer block, and the lower bridge chip are stacked, the collector of the lower bridge chip is connected to the output electrode, the emitter of the lower bridge chip is connected to the lower bridge buffer block through the fourth connection layer, and the lower bridge buffer block is connected to the lower bridge substrate through the fifth connection layer.

3. The power module according to claim 2, further comprising:

a second connecting layer and an upper bridge heat dissipation baseplate, wherein the upper bridge heat dissipation baseplate, the upper bridge substrate, the upper bridge chip, the upper bridge buffer block, the lower bridge chip, the lower bridge buffer block, and the lower bridge substrate are stacked in this order, and the upper bridge substrate is connected to the upper bridge heat dissipation baseplate through the second connecting layer.

4. The power module according to claim 3, further comprising:

a sixth connecting layer and a lower bridge heat dissipation baseplate, wherein the upper bridge heat dissipation baseplate, the upper bridge substrate, the upper bridge chip, the upper bridge buffer block, the lower bridge chip, the lower bridge buffer block, the lower bridge substrate and the lower bridge heat dissipation baseplate are stacked in this order, and the lower bridge substrate is connected to the lower bridge heat dissipation baseplate through the sixth connecting layer.

5. The power module according to claim 4, wherein a back side of the upper bridge substrate and a back side of the lower bridge substrate are respectively welded or sintered to the upper bridge heat dissipation baseplate and the lower bridge heat dissipation baseplate.

6. The power module according to claim 4, wherein an installation plane of the positive input electrode and an installation plane of the negative input electrode are located on different horizontal planes.

7. The power module according to claim 4, wherein the installation plane of the positive input electrode and the installation plane of the negative input electrode are located on different planes and both are at a 90° angle to the horizontal plane.

8. The power module according to claim 4, further comprising:

an upper bridge heat dissipation water channel and a lower bridge heat dissipation water channel, wherein the upper bridge heat dissipation baseplate is mounted together with the upper bridge heat dissipation water channel, and the lower bridge heat dissipation baseplate is mounted together with the lower bridge heat dissipation water channel.

9. The power module according to claim 8, wherein the upper bridge heat dissipation baseplate is mounted to the upper bridge heat dissipation water channel through an upper bridge sealing ring, the lower bridge heat dissipation baseplate is mounted to the lower bridge heat dissipation water channel through a lower bridge sealing ring, and the upper bridge heat dissipation water channel and the lower bridge heat dissipation water channel are secured together by a fastener.

10. The power module according to claim 9, wherein multiple power modules are stacked in a direction perpendicular to the chips, and for two adjacent power modules, the lower bridge heat dissipation water channel of a lower power module of the two adjacent power modules and the upper bridge heat dissipation water channel of an upper power module of the two adjacent power modules form a two-in-one water channel, the two-in-one water channel is an independent water channel internally divided into two independent water channel spaces which are respectively an independent upper water channel space and an independent lower water channel space.

11. The power module according to claim 9, further comprising a driving board, wherein the driving board is arranged on a side of the upper bridge heat dissipation water channel and the lower bridge heat dissipation water channel and is disposed close to one side of the signal transmission terminal where the control terminal is located.

12. The power module according to claim 1, wherein the upper bridge chip, the output electrode, and the lower bridge chip are stacked in sequence.

13. The power module according to claim 1, further comprising:

a first connection layer, wherein the collector of the upper bridge chip is connected to the upper bridge substrate through the first connection layer.

14. The power module according to claim 1, wherein the upper bridge chip and the lower bridge chip both are arranged in a lateral direction.

15. The power module according to claim 1, wherein the upper bridge chip and the lower bridge chip both are arranged in a longitudinal direction.

16. The power module according to claim 1, wherein a sampling terminal at the emitter of the upper bridge chip, a sampling terminal at the collector of the upper bridge chip, and the control terminal of the upper bridge chip, and a sampling terminal at the emitter of the lower bridge chip, a sampling terminal at the collector of the lower bridge chip, and the control terminal of the lower bridge chip are all connected to the signal transmission terminal through their respective bonding wires.

17. A power module, comprising:

a positive input electrode, a negative input electrode, an upper bridge substrate, a lower bridge substrate, an upper bridge chip, a lower bridge chip, an output electrode, and a signal transmission terminal, wherein the upper bridge substrate, the upper bridge chip, the lower bridge chip, and the lower bridge substrate are stacked in sequence, wherein:

the upper bridge chip has a collector connected to the upper bridge substrate, and an emitter connected to the output electrode, the lower bridge chip has a collector connected to the output electrode, a sampling terminal at the emitter of the upper bridge chip, a sampling terminal at the collector of the upper bridge chip, and a control terminal of the upper bridge chip, and a sampling terminal at an emitter of the lower bridge chip, a sampling terminal at the collector of the lower bridge chip, and a control terminal of the lower bridge chip are connected to the signal transmission terminal, the positive input electrode is connected to the upper bridge substrate, and the negative input electrode is connected to the lower bridge substrate, the power module further comprising: a thermistor and a thermistor terminal, wherein the thermistor is connected to the thermistor terminal through its bonding wire.

18. The power module according to claim 17, wherein the thermistor terminal and the signal transmission terminal both have bent structures.

* * * * *